(12) United States Patent
Kawahashi

(10) Patent No.: US 9,183,824 B2
(45) Date of Patent: Nov. 10, 2015

(54) TIMBRE SELECTOR, MUSICAL INSTRUMENT, AND TIMBRE SELECTING METHOD

(71) Applicant: YAMAHA CORPORATION, Hamamatsu-shi, Shizuoka-ken (JP)

(72) Inventor: Satsuki Kawahashi, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 45 days.

(21) Appl. No.: 14/246,559

(22) Filed: Apr. 7, 2014

(65) Prior Publication Data

US 2014/0298974 A1 Oct. 9, 2014

(30) Foreign Application Priority Data

Apr. 8, 2013 (JP) ................................. 2013-080149

(51) Int. Cl.
  *G10H 1/00* (2006.01)
  *G10H 1/18* (2006.01)
  *G10H 3/18* (2006.01)
  *H03G 5/02* (2006.01)

(52) U.S. Cl.
  CPC ................ *G10H 3/18* (2013.01); *G10H 3/186* (2013.01); *H03G 5/02* (2013.01); *G10H 3/182* (2013.01)

(58) Field of Classification Search
  None
  See application file for complete search history.

(56) References Cited

U.S. PATENT DOCUMENTS

| | | | |
|---|---|---|---|
| 2,503,885 A | 4/1950 | Nygren | |
| 3,085,460 A | 4/1963 | Edwards | |
| 3,253,079 A * | 5/1966 | McDonald | 84/702 |
| 4,117,413 A | 9/1978 | Moog | |
| 4,191,082 A * | 3/1980 | Koike | 84/622 |
| 4,803,731 A * | 2/1989 | Niimi et al. | 381/63 |
| 5,136,918 A * | 8/1992 | Riboloff | 84/723 |
| 5,634,798 A * | 6/1997 | Suh | 434/307 A |
| 6,034,316 A * | 3/2000 | Hoover | 84/738 |
| 7,390,960 B1 * | 6/2008 | Arnold | 84/735 |
| 2005/0211081 A1* | 9/2005 | Bro et al. | 84/737 |
| 2014/0298974 A1* | 10/2014 | Kawahashi | 84/622 |

FOREIGN PATENT DOCUMENTS

WO   WO 92/13335 A1   8/1992

OTHER PUBLICATIONS

Kuehn, "Cadfaels Kleine Sammlung von Schaltplaenen, Version 3.32," 2011, XP055125602, with English translation (27 pages).
Extended European Search Report dated Jul. 7, 2014 (7 pages).

* cited by examiner

*Primary Examiner* — Marlon Fletcher
(74) *Attorney, Agent, or Firm* — Crowell & Moring LLP

(57) ABSTRACT

A timbre selector includes a first signal processing unit, a second signal processing unit and a first switch. The first signal processing unit includes a first input terminal, a first filter and a first output terminal. The first input terminal receives a first tone signal. The first filter processes the first tone signal to generate a first processed signal. The second signal processing unit includes a second input terminal, a second filter and a second output terminal. The second input terminal receives a second tone signal. The second filter processes the second tone signal to generate a second processed signal. The first switch is connected to the first output terminal at the first position. The first switch is connected to the first and second output terminals at the second position. The first switch is connected to the second output terminal at the third position.

13 Claims, 7 Drawing Sheets

FIG. 2

| LEVER POSITION | MOVING CONTACT POSITION |
|---|---|
| P1 | SW1 |
| P2 | SW1 |
| P3 | SW1 |
| P4 | SW1 |
| P5 | SW1 |

TIMBRE SELECTOR, MUSICAL INSTRUMENT, AND TIMBRE SELECTING METHOD

BACKGROUND OF THE INVENTION

1. Field of the Invention

The present invention relates to a device that selects a timbre.

Priority is claimed on Japanese Patent Application No. 2013-080149, filed Apr. 8, 2013, the content of which is incorporated herein by reference.

2. Description of Related Art

In electric musical instruments such as an electric bass (hereinbelow simply called a bass), a timbre selector is sometimes provided that changes the timbre of a tone presented by a signal detected by a pickup (hereinbelow called a pickup signal) to various timbres (for example, a timbre that suppresses the high range and emphasizes the low range).

FIG. 9A is a circuit diagram that shows the constitution of a timbre selector of related art. The timbre selector shown in FIG. 9A includes filters 41, 42, and 43 that change the timbre of the tone that the pickup signal presents, and a switch 50 that has three fixed contacts 51, 52, and 53 and one moving contact 54. The output terminals of the filters 41 to 43 are respectively connected to the fixed contacts 51 to 53 of the switch 50. The switch 50 is for example a lever switch (see, U.S. Pat. No. 2,503,885) in which a moving contact 54 moves together with a lever not shown. The lever of this switch 50 has a position at which the moving contact 54 is connected to the fixed contact 51, a position at which it is connected to the fixed contact 52, and a position at which it is connected to the fixed contact 53. In this timbre selector, a pickup signal is supplied to the filters 41 to 43, and the output signals of the filters 41 to 43 are respectively supplied to the fixed contacts 51 to 53 of the switch 50. The user connects the moving contact 54 with a desired contact among the fixed contacts 51 to 53 by moving the moving contact 54 by operation of the lever. The moving contact 54 outputs the output signal of the filter supplied to that desired fixed contact.

FIG. 9B shows another constitution that changes the timbre of a tone that a pickup signal presents. The device that is shown in FIG. 9B includes filters 61 and 62 that change the timbre of a tone that the pickup signal presents, and a variable resistor 70. The variable resistor 70 has a fixed resistor 71, and a slider 72 that makes contact with the fixed resistor 71 and that enables a user to slide the contact position. The output terminals of the filters 61 and 62 are connected to both ends of the fixed resistor 71. With this constitution, the pickup signal is supplied to the filters 61 and 62, and a signal that is a composite of the signal that has passed through the filter 61 and the signal that has passed through the filter 62 is output from the slider 72 of the variable resistor 70. By sliding the slider 72 between both ends of the fixed resistor 71 to change its position, it is possible to change the composition ratio of the signal that has passed through the filter 61 and the signal that has passed through the filter 62. As a result, it is possible to steplessly alter the timbre of the tone that the signal output from the slider 72 presents in a range between the timbre of the tone that the signal that has passed through the filter 61 presents and the timbre of the tone that the signal that has passed through the filter 62 presents.

However, in a timbre selector that has the switch 50 shown in FIG. 9A, there is the problem that it is not possible to obtain a greater variety of timbres than the number of filters 41 to 43 that are connected to the fixed contacts 51 to 53 of the switch 50.

The device that is shown in FIG. 9B has the problem in which, when the position of the slider 72 of the variable resistor 70 is changed to another position, it is difficult to correctly return it to the original position, and so the reproducibility of a timbre is poor. Also, this device has a constitution that connects the filters 61 and 62 to both ends of the fixed resistor 71 in the variable resistor 70. For this reason, there is the problem of the number of filters being limited to two, and increasing the number of filters being difficult.

SUMMARY OF THE INVENTION

The present invention has been achieved in view of the above circumstances. An object of the present invention is to provide a timbre selector capable of selecting, with good reproducibility, timbres of a greater variety than the number of filters that are mounted, a musical instrument, and a timbre selecting method.

A timbre selector according to an aspect of the present invention includes a first signal processing unit, a second signal processing unit and a first switch. The first signal processing unit includes a first input terminal, a first filter and a first output terminal. The first input terminal receives a first tone signal. The first filter process the first tone signal to generate a first processed signal. The first output terminal outputting the first processed signal. The second signal processing unit includes a second input terminal, a second filter and a second output terminal. The second input terminal receives a second tone signal. The second filter processes the second tone signal to generate a second processed signal. The second output terminal outputs the second processed signal. The first switch switches between a plurality of positions including first, second and third positions. The first switch is connected to the first output terminal at the first position. The first switch is connected to the first and second output terminals at the second position. The first switch is connected to the second output terminal at the third position. The first switch outputs the first processed signal at the first position. The first switch outputting the first and second processed signals at the second position. The first switch outputs the second processed signal at the third position.

The aforementioned timbre selector can select any one of the timbre presented by the first processed signal generated by the first filter, the timbre presented by the second processed signal generated by the second filter, and the timbre presented by signals including the first processed signal and the second processed signal. Accordingly, it is possible to select with good reproducibility timbres of a greater variety than the number of filters that are mounted.

A musical instrument according to an aspect of the present invention includes the above timbre selector.

A timbre selecting method according to an aspect of the present invention includes: processing a first tone signal by a first signal processing unit to generate a first processed signal; processing a second tone signal by a second signal processing unit to generate a second processed signal; connecting a first switch to one or both of the first and second signal processing units; outputting the first processed signal when the first switch is connected to the first signal processing unit; outputting the second processed signal when the first switch is connected to the second signal processing unit; and outputting the first and second processed signals when the first switch is connected to the first and second signal processing units.

BRIEF DESCRIPTION OF THE DRAWINGS

FIG. 2 is a diagram for explaining positions of a lever L coupled to a moving contact 4 of a switch SW1 of the timbre selector shown in FIG. 1A, and the connection relation of fixed contacts 1 to 3 and the moving contact 4 of the switch SW1.

DETAILED DESCRIPTION OF THE INVENTION

Hereinbelow, an embodiment of this invention shall be described referring to the appended drawings.

Embodiment

Figure 1A:
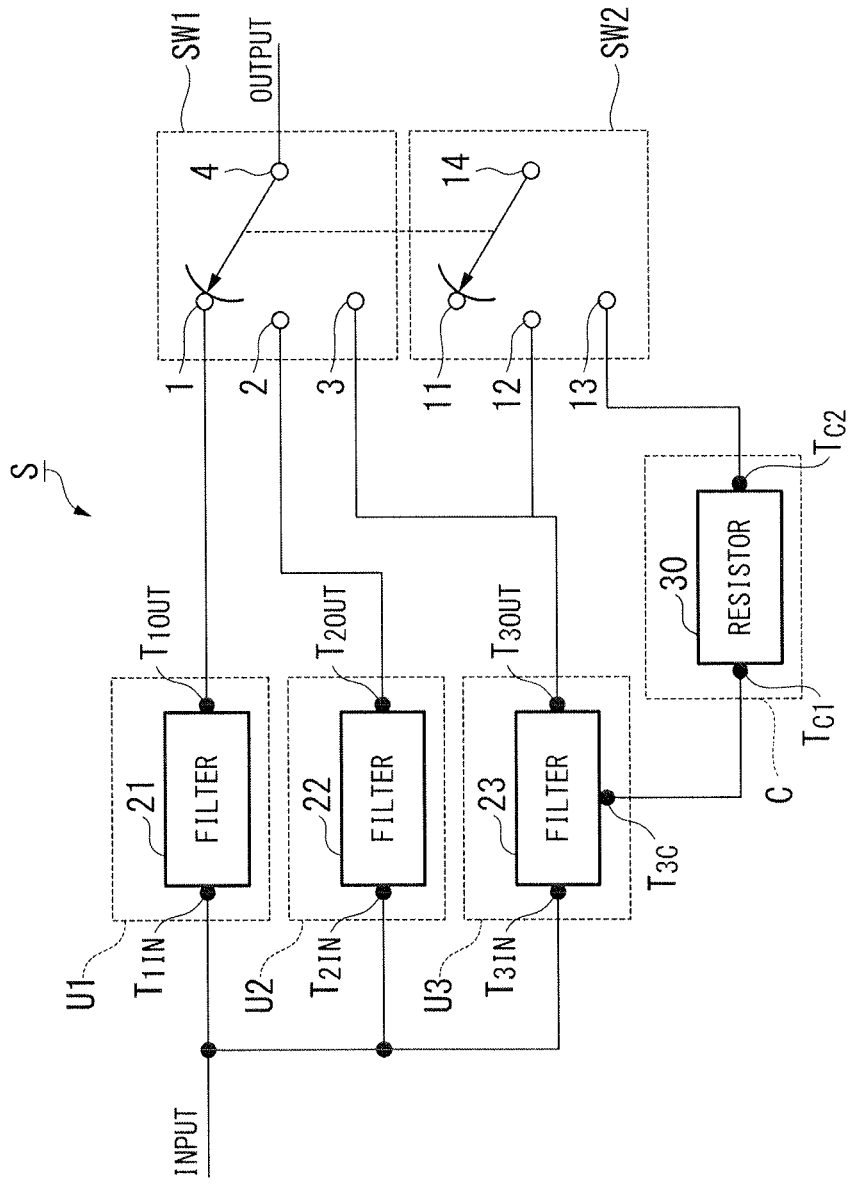
FIG. 1A is a circuit diagram that shows the constitution of a timbre selector S according to an embodiment of the present invention.
Figure 1B:
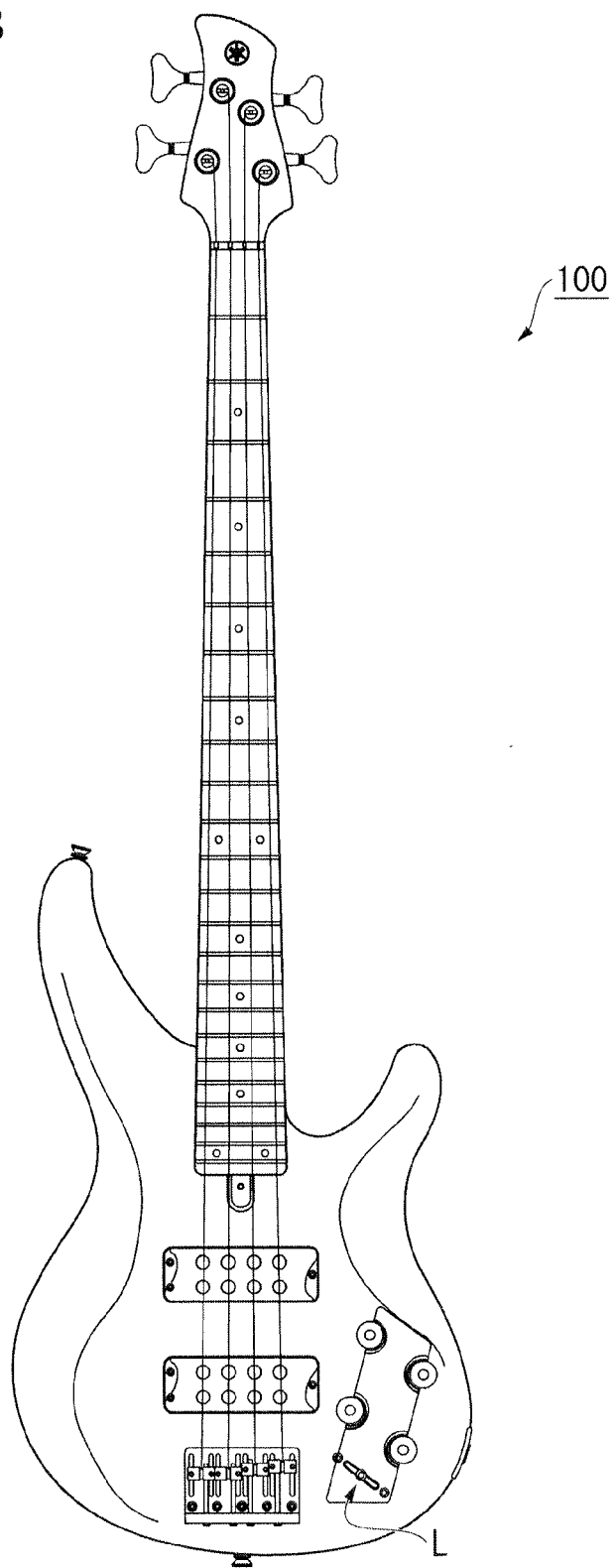
FIG. 1B is a schematic diagram that shows a bass 100 that includes the timbre selector S.

FIG. 1A is a circuit diagram that shows the constitution of a timbre selector S according to the embodiment of this invention. As shown in FIG. 1B, the timbre selector S of the present embodiment may be mounted in, for example, a bass (musical instrument) 100. The timbre selector S causes the timbre of a tone that is detected by the pickup and emitted via an amplifier to become the timbre selected by the user (performer).

The timbre selector S includes first to third signal processing units U1 to U3, a switch SW1, a switch SW2, and a circuit element C. The first signal processing unit U1 has an input terminal $T_{1IN}$, a filter 21, and an output terminal $T_{1OUT}$. The second signal processing unit U2 has an input terminal $T_{2IN}$, a filter 22, and an output terminal $T_{2OUT}$. The third signal processing unit U3 has an input terminal $T_{3IN}$, a filter 23, an output terminal $T_{3OUT}$ and a connection terminal $T_{3C}$. The circuit element C has a first terminal $T_{c1}$, a resistor (circuit element) 30, and a second terminal $T_{c2}$.

The filters 21, 22 and 23 are analog filters that include for example resistors and capacitors. In greater detail, the filter 21 is a notch filter that attenuates the middle frequency component. The filter 22 is a filter that makes the gain constant from low frequencies to high frequencies (frequency response is flat). The filter 23 is a low-pass filter that attenuates the frequency component that is higher than a cut-off frequency. The input terminals $T_{1IN}$ to $T_{3IN}$ of the filters 21 to 23 are connected to each other. The input terminals $T_{1IN}$ to $T_{3IN}$ receive the input of the pickup signals (first to third tone signals).

The switch SW1 has three fixed contacts 1, 2 and 3 that are arranged in sequence, and one moving contact 4. The output terminals $T_{1OUT}$ to $T_{3OUT}$ of the filters 21, 22 and 23 are respectively connected to the fixed contacts 1, 2 and 3 of the switch SW1. The moving contact 4 of the switch SW1 functions as the output terminal of the timbre selector S.

The switch SW1 may be for example a lever switch in which the moving contact 4 and a lever L that the user operates are coupled. FIG. 2 is a diagram for explaining the connection relation of the fixed contacts 1 to 3 and the moving contact 4 in the switch SW1 (that is to say, the positions of the moving contact 4). As shown in FIG. 2, the lever L has five positions P1 to P5 as positions that it can take. The lever L is kept in one position that is selected by the operation of the user among the positions P1 to P5. The moving contact 4 of the switch SW1 moves together with the lever L. Described in greater detail, when the position of the lever L is at the position P1, the moving contact 4 of the switch SW1 is connected to the fixed contact 1. When the position of the lever L is at the position P2, the moving contact 4 of the switch SW1 is connected to both the fixed contact 1 and the fixed contact 2. When the position of the lever L is at the position P3, the moving contact 4 of the switch SW1 is connected to the fixed contact 2. When the position of the lever L is at the position P4, the moving contact 4 of the switch SW1 is connected to both the fixed contact 2 and the fixed contact 3. When the position of the lever L is at the position P5, the moving contact 4 of the switch SW1 is connected to the fixed contact 3.

The switch SW2 has the same constitution as the switch SW1. The switch SW2 has three fixed contacts 11, 12 and 13 that are arranged in sequence, and one moving contact 14. Explained in greater detail, the fixed contact 11 is open. The fixed contact 12 is connected to the output terminal $T_{3OUT}$ of the filter 23 (that is, the fixed contact 3 of the switch SW1). The fixed contact 13 is connected to the connection terminal $T_{3C}$ of the filter 23 via the resistor 30 (the connection terminal $T_{3C}$ is an arbitrary node within the circuit of the filter 23). The moving contact 14 is open. The moving contact 14 of the switch SW2 moves together with the moving contact 4 of the switch SW1. That is to say, the moving contact 14 moves together with the lever L. The moving contact 14 is connected to the fixed contacts 11 to 13. That is to say, when the position of the lever L is at the position P1, the moving contact 14 of the switch SW2 is connected to the fixed contact 11. When the position of the lever L is at the position P2, the moving contact 14 of the switch SW2 is connected to both the fixed contact 11 and the fixed contact 12. When the position of the lever L is at the position P3, the moving contact 14 of the switch SW2 is connected to the fixed contact 12. When the position of the lever L is at the position P4, the moving contact 14 of the switch SW2 is connected to both the fixed contact 12 and the fixed contact 13. When the position of the lever L is at the position P5, the moving contact 14 of the switch SW2 is connected to the fixed contact 13. Accordingly, when the position of the lever L is at the position P4, the switch SW2 interposes the resistor 30 between the connection terminal $T_{3C}$ in the circuit of the filter 23 (an arbitrary node of the filter 23) and the output terminal $T_{3OUT}$ of the filter 23 (the fixed contact 3 of the switch SW1).

In the timbre selector S according to the present embodiment, a common pickup signal is supplied to each of the filters 21 to 23. The output signals of the filters 21 to 23 are respectively supplied to the fixed contacts 1 to 3 of the switch SW1. The user, by operating the lever L, selects the position of the lever L from among the positions P1 to P5. The moving contact 4 moves in accordance with the operation of the lever L. As a result, the moving contact 4 connects with the desired fixed contact among the fixed contacts 1 to 3. The moving contact 4 outputs the output signal of the filter that is supplied to the desired fixed contact. At this time, the timbre of the tone presented by the output signal of the timbre selector S changes in accordance with the frequency response of the filter that is connected to the desired fixed contact.

FIG. 3 to FIG. 7 show the frequency responses of the respective filters that are selected when the position of the lever L is at each of the positions P1 to P5.

Figure 3:
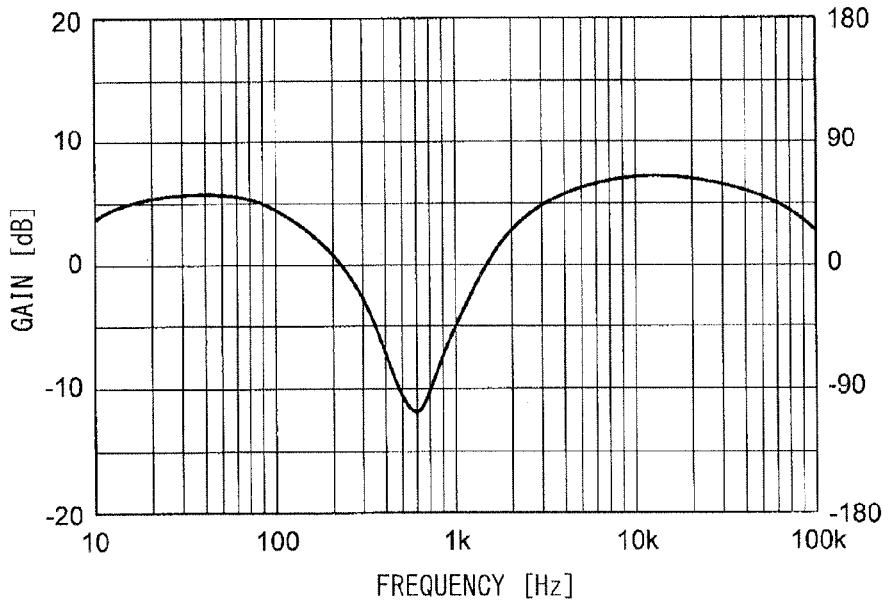
FIG. 3 is a graph that shows the frequency response of a filter 21, which is selected when the lever L, which is coupled to the moving contact 4 of the switch SW1 of the timbre selector S shown in FIG. 1A, is at a position P1.

In the case of the position of the lever L being at the position P1, the moving contact 4 is connected to the fixed contact 1. Therefore, the signal (first processed sig) that has passed through the filter 21, which is connected to the fixed contact 1, is output from the moving contact 4. The filter 21 that is connected to the fixed contact 1 that has been selected in this case shows a frequency response in which the low-frequency and high-frequency gains are boosted, while the middle-frequency gain is reduced, as shown in FIG. 3. Thereby, the signal that has passed through the filter 21, that is to say, the tone presented by the output signal of the timbre selector S, presents a timbre in which the low range (bass) and high range (treble) are enhanced, while the midrange (middle) is suppressed. This timbre is suited to a slapping technique. A slapping technique is a playing technique that combines the action of striking a string with the thumb and the action of snapping a string with the middle finger to cause it to hit the fingerboard.

In the case of the position of the lever L being at the position P3, the moving contact 4 is connected to the fixed contact 2. Therefore, the signal (second processed signal (or first processed signal)) that has passed through the filter 22, which is connected to the fixed contact 2, is output from the moving contact 4. The filter 22 that is connected to the fixed contact 2 that has been selected in this case shows a frequency response in which the gain is almost constant from the low frequencies to the high frequencies. Thereby, the signal that has passed through the filter 22, that is to say, the tone presented by the output signal of the timbre selector S, presents a uniform timbre from the low range to the high range.

Figure 7:
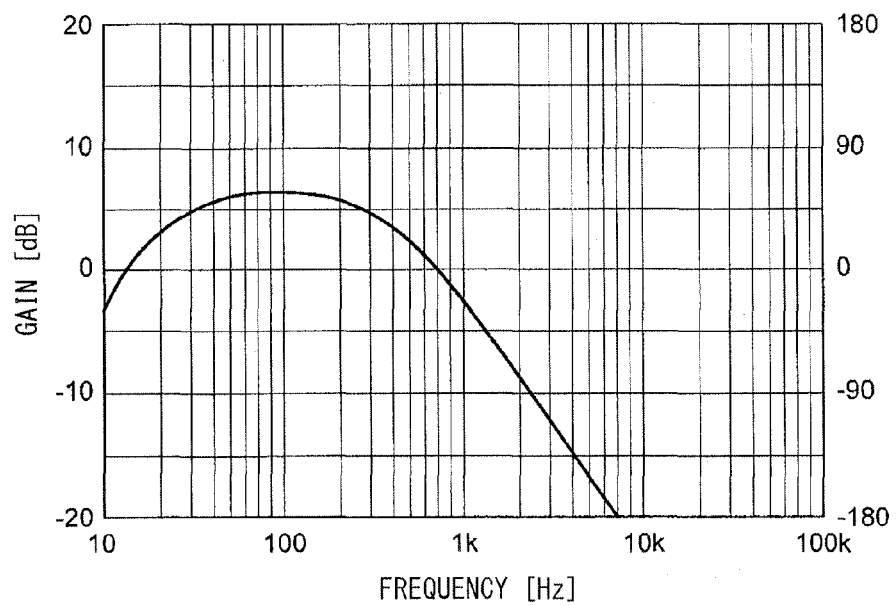
FIG. 7 is a graph that shows the frequency response of the filter 23, which is selected when the lever L, which is coupled to the moving contact 4 of the switch SW1 of the timbre selector S shown in FIG. 1A, is at a position P5.

In the case of the position of the lever being at position P5, the moving contact 4 is connected to the fixed contact 3. Therefore, the signal (third processed signal (or the second processed signal)) that has passed through the filter 23, which is connected to the fixed contact 3, is output from the moving contact 4. The filter 23 that is connected to the fixed contact 3 that has been selected in this case shows a frequency response in which the low-frequency and middle-frequency gains are boosted, while the high-frequency gain is reduced, as shown in FIG. 7. Thereby, the signal that has passed through the filter 23, that is to say, the tone presented by the output signal of the timbre selector S, presents a timbre in which the low range and the middle range are boosted, while the high range is suppressed. This timbre is suited to the playing of bass solos.

Figure 4:
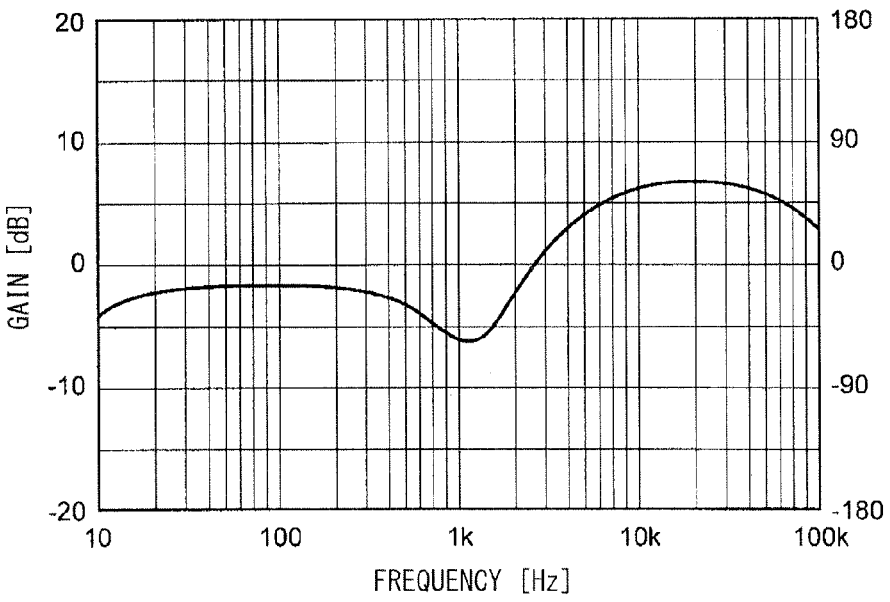
FIG. 4 is a graph that shows the frequency response of a filter that is a composite of the filter 21 and a filter 22 and which is selected when the lever L, which is coupled to the moving contact 4 of the switch SW1 of the timbre selector S shown in FIG. 1A, is at a position P2.
Figure 5:
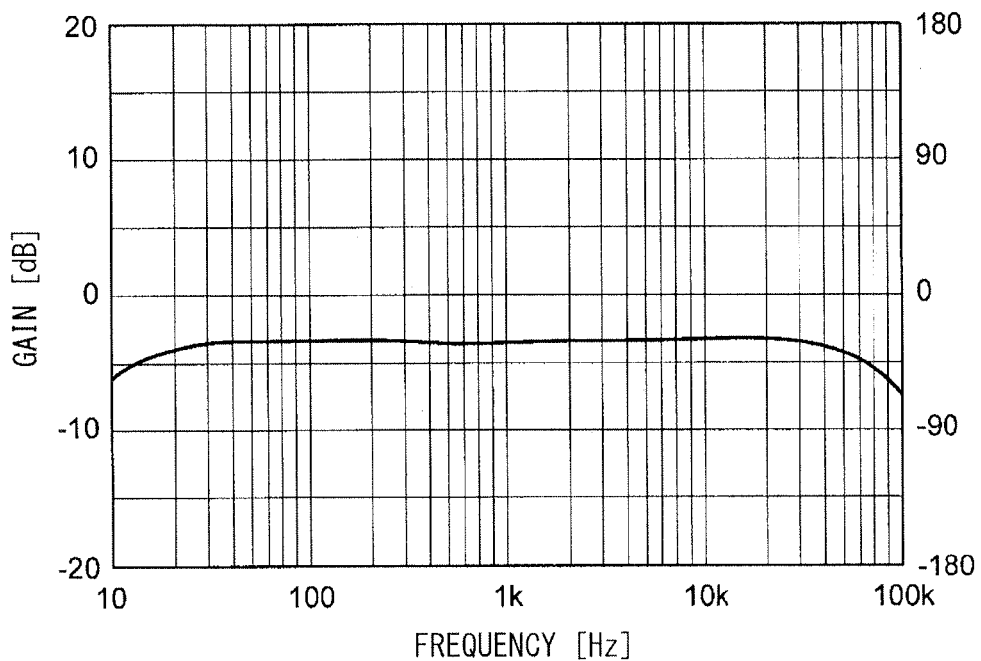
FIG. 5 is a graph that shows the frequency response of the filter 22, which is selected when the lever L, which is coupled to the moving contact 4 of the switch SW1 of the timbre selector S shown in FIG. 1A, is at a position P3.

In the case of the position of the lever L being at the position P2, the moving contact 4 is connected to both the fixed contact 1 and the fixed contact 2. As a result, the filter 21 and the filter 22 are connected in parallel. In this case, a signal that is a composite of the signal that has passed through the filter 21, which is connected to the fixed contact 1, and the signal that has passed through the filter 22, which is connected to the fixed contact 2, is output from the moving contact 4. That is to say, the composite filter of this case, that is, the filter that includes the filter 21 that is connected to the selected fixed contact 1 and the filter 22 that is connected to the selected fixed contact 2 being connected in parallel shows a frequency response that combines the frequency response of the filter 21 and the frequency response of the filter 22. The filter in this case, as shown in FIG. 4, shows a frequency response in which the high-frequency gain is boosted. Thereby, a signal that is a composite of the signal that has passed through the filter 21 and the signal that has passed through the filter 22, that is to say, the tone presented by the output signal of the timbre selector S, presents a timbre in which the low range is boosted. This timbre is suited to a picking technique.

Figure 6:
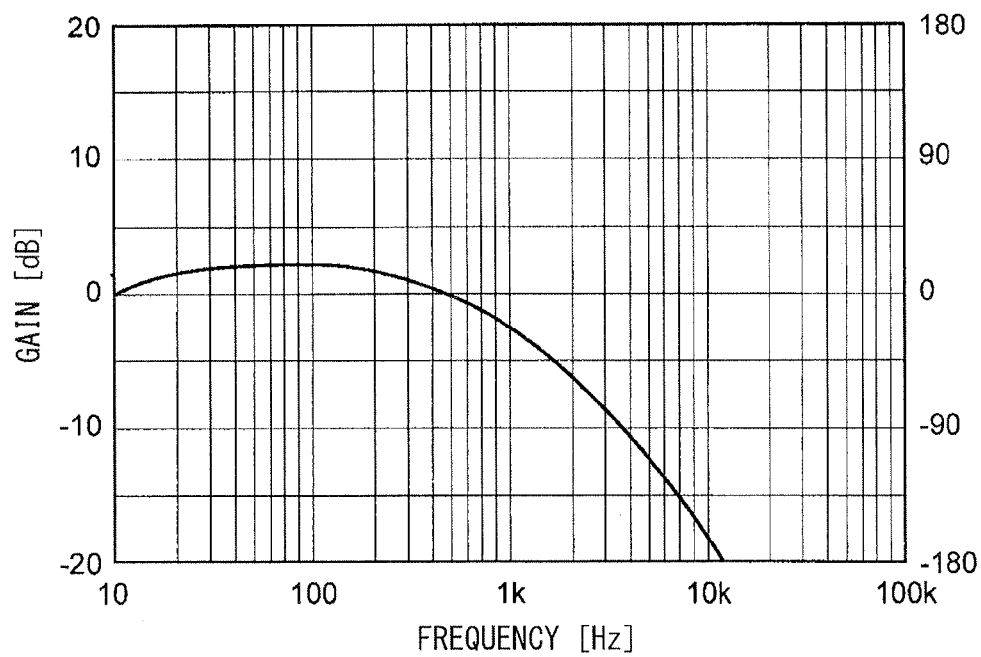
FIG. 6 is a graph that shows the frequency response of a filter that is a composite of the filter 22, a filter 23 and a resistor 30 and which is selected when the lever L, which is coupled to the moving contact 4 of the switch SW1 of the timbre selector S shown in FIG. 1A, is at a position P4.

In the case of the position of the lever L being at the position P4, the moving contact 14 is connected to both the fixed contact 12 and the fixed contact 13. As a result, the resistor 30 is interposed between a node of the circuit of the filter 23 and the output terminal $T_{3OUT}$ of the filter 23. Moreover, since the moving contact 4 is connected to both the fixed contact 2 and the fixed contact 3, the filter 22 and the filter 23 are connected in parallel. In this case, a signal that is a composite of the signal that has passed through the filter 22 and the signal that has passed through the filter 23 with the resistor 30 interposed is output from the moving contact 4. That is to say, the composite filter of this case, specifically, the filter that includes the filter 22 and the filter 23 with the resistor 30 interposed therebetween being connected in parallel, shows a frequency response that combines the frequency response of the filter 22 and the frequency response of the filter 23 in which the resistor 30 is interposed between the connection terminal $T_{3C}$ of the filter 23 (the node in the circuit of the filter 23) and the output terminal $T_{3OUT}$ of the filter 23. The filter in this case shows a frequency response in which the low-frequency gain is boosted and the high-frequency gain is lowered, as shown in FIG. 6. Thereby, a signal that is a composite of the signal that has passed through the filter 22 and the signal that has passed through the filter 23 in which the resistor 30 is interposed, that is to say, the tone presented by the output signal of the timbre selector S, presents a timbre in which the low range is boosted, and the high range is suppressed. This timbre is suited to the case of finger picking.

Figure 8:
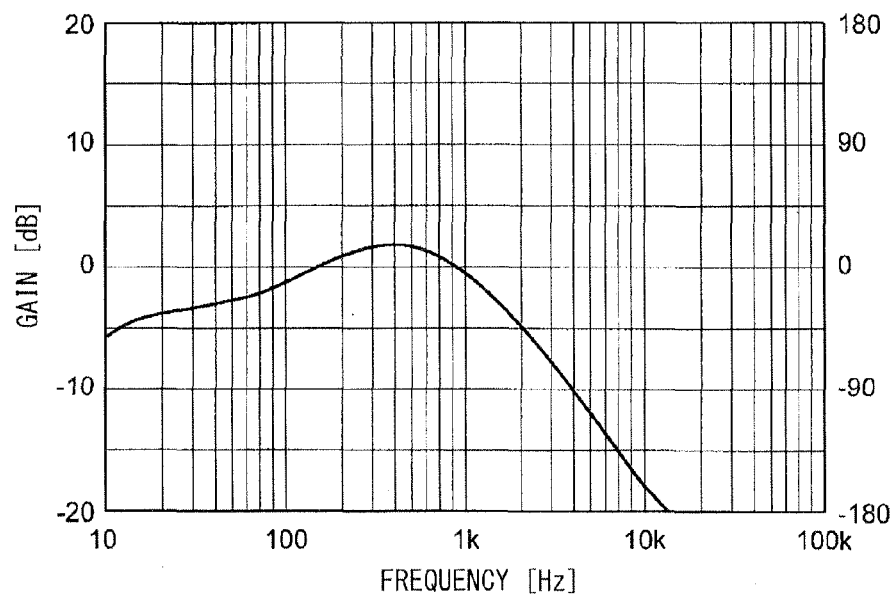
FIG. 8 is a graph that shows the frequency response of a filter that is a composite of the filter 22 and the filter 23 in the case of not interposing the resistor 30 when the lever L, which is coupled to the moving contact 4 of the switch SW1 of the timbre selector S shown in FIG. 1A, is at a position P4.
Figure 9A:
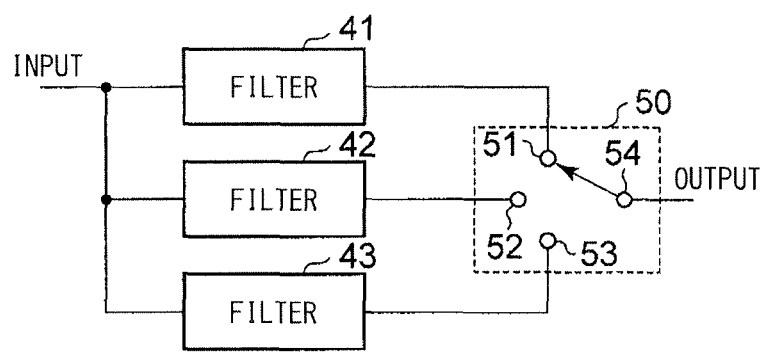
FIG. 9A is a circuit diagram that shows the constitution of a timbre selector according to related art.
Figure 9B:
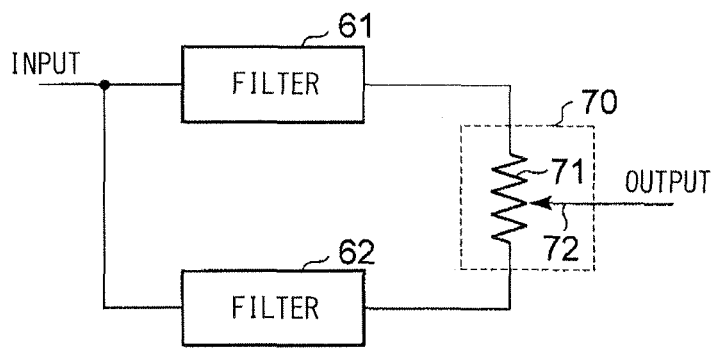
FIG. 9B is a circuit diagram that shows the constitution of a timbre selector according to another related art.

As stated above, in the timbre selector S according to the present embodiment, in the case of the position of the lever L being at the position P4, the resistor 30 is interposed between the node in the circuit of the filter 23 and the output terminal $T_{3OUT}$ of the filter 23. The reason for the timbre selector S having this constitution shall be described below. The frequency responses of the filter 22 and the filter 23 are respectively decided so that the timbre presented by the output signal of the timbre selector S when the position of the lever L is at the position P3 and the timbre presented by the output signal of the timbre selector S when the position of the lever L is at the position P5 become the respective desired timbres (refer to FIG. 5 and FIG. 7). In this case, the frequency response that combines the frequency response of the filter 22 and the frequency response of the filter 23 (that is to say, the frequency responses of the filters when the position of the lever L is at the position P4) does not present a desired timbre. FIG. 8 is a graph that shows the frequency response that combines the frequency response of the filter 22 and the frequency response of the filter 23 in the case of not interposing the resistor 30. In the frequency response shown in FIG. 8, the high-frequency gain is reduced while the low-frequency gain is hardly boosted. It is preferable that the frequency response of the filters that are selected when the position of the lever L is at the position P4 to be a response in which the low-frequency gain is further boosted compared to the frequency response shown in FIG. 8. In order to further raise the low-frequency gain, the resistor 30 is interposed between the node in the circuit of the filter 23 and the output terminal of the filter 23 (refer to FIG. 6). That is to say, the resistor 30 functions as a filter response adjusting element that changes the frequency response of the filter 23 to adjust the combined frequency response so that the frequency response that is a composite of the frequency response of the filter 22 and the altered frequency response of the filter 23 becomes a frequency response that presents the preferable timbre. The frequency response that is a composite of the frequency response of the filter 21 and the frequency response of the filter 22 presents the desired timbre. For this reason, adjustment of the frequency responses of the filters that are selected when the position of the lever L is at the position P2 (interposition of a filter response adjusting element) is not performed.

Next, the case of a user playing the bass 100 in which the timbre selector S of the present embodiment is mounted shall be described. The user, for example when intending to play the bass 100 with a slapping technique, moves the lever L of the timbre selector S to put its position at the position P1. Then, when the user plays the bass 100 with a slapping technique, the tone presented by the pickup signal is changed to a timbre suited to the slapping technique by the timbre selector S and then emitted from the amplifier or the like. In the case of changing the playing technique from slapping to picking, the user moves the lever L of the timbre selector S to switch the position thereof from the position P1 to the position P2. Then, when the user plays the bass 100 with a picking technique, the tone presented by the pickup signal is changed to a timbre suited to the picking technique by the timbre selector S and then emitted from the amplifier or the like. In this way, by selecting the position P1 to P5 of the lever L of the timbre selector S depending on the playing technique of the user, the user can obtain a timbre suited to that playing technique. The user can not only obtain the desired timbre by playing the bass 100 after having selected the position P1 to P5 of the lever L of the timbre selector S, but may also select (switch) the position P1 to P5 of the lever L of the timbre selector S after playing the bass 100 (after sounding a string) to change the timbre while the tone is being produced.

As described above, the timbre selector S according to the present embodiment includes the three filters 21 to 23 in which a common pickup signal is input, the fixed contacts 1 to 3, the moving contact 4 that moves together with the lever L, and the switch SW1. The fixed contacts 1 to 3 are arranged in sequence, and are respectively connected to the output terminals $T_{1OUT}$ to $T_{3OUT}$ of the filters 21 to 23. The switch SW1 has a plurality of positions, and in accordance with the operation of the lever L, one position among the plurality of positions is selected. The plurality of positions includes positions in which the moving contact 4 is connected to one of the fixed contacts 1 to 3 (the positions of the moving contact 4 when the position of the lever L is at the position P1, P3, and P5) and positions in which the moving contact 4 is connected to two of the fixed contacts 1 to 3 (the positions of the moving contact 4 when the position of the lever L is position P2 and P4). For this reason, with the moving contact 4 at a position of being connected to one of the fixed contacts 1 to 3 (that is to say, at the position P1, P3, or P5), it is possible to select the timbre of a tone presented by a signal that has passed through the filter 21 to 23 respectively connected to the fixed contact 1 to 3 that has been selected. Moreover, with the moving contact 4 at a position of being connected to two of the fixed contacts 1 to 3 (that is to say, at the position P2 or P4), it is possible to select the timbre of a tone presented by a signal that is a composite of a signal that has passed through the filter 21 to 23 connected to one fixed contact 1 to 3, and a signal that has passed through the filter 21 to 23 connected to another fixed contact 1 to 3 of the two fixed contacts 1 to 3 that have been selected. That is to say, it is possible to select a greater variety of timbres than the number of filters 21 to 23 that are mounted. Also, even if the position P1 to P5 of the lever L is switched to change the timbre, since it is possible to return to the original timbre by returning the lever L to the original position P1 to P5, the timbre reproducibility is good. Also, since the number of filters 21 to 23 that are mounted is fewer than the variety of timbres, it is possible to reduce the number of parts, and therefore keep down the price.

In the timbre selector S according to the present embodiment, at the position in which the moving contact 4 is connected to both the fixed contact 2 and the fixed contact 3, the resistor 30 is interposed between the node in the circuit of the filter 23 that is connected to the fixed contact 3 and the output terminal $T_{3OUT}$ of the filter 23 by the switch SW2 that has the moving contact 14 that moves together with the moving contact 4 of the switch SW1. For this reason, even in the case of the timbre of the tone presented by the signal that is a composite of the signal that has passed through the filter 22 that is connected to the fixed contact 2 and the signal that has passed through the filter 23 that is connected to the fixed contact 3 not becoming the desired timbre, it is possible to adjust the timbre of the tone presented by the composite signal to the desired timbre. That is to say, by changing the frequency response of the filter 23 by interposing the resistor 30 between the node in the circuit of the filter 23 and the output terminal of the filter 23, it is possible to adjust the timbre of the tone presented by the signal that is a composite of the signal that has passed through the filter 22, and the signal that has passed through the filter 23 whose frequency response has been changed.

In the present embodiment, the moving contact 14 of the switch SW2 that interposes the resistor 30 moves together with the moving contact 4 of the switch SW1 that is coupled to the lever L that the user operates. With this constitution, it is possible to perform adjustment of the timbre without the user being aware of it.

<Modifications>

Modifications of the embodiment described above shall be described.

(Modification 1)

In the embodiment described above, the switch SW1 is a lever switch in which the lever L is coupled to the moving contact 4, but it is not limited thereto. For example, the switch SW1 may be a toggle switch. The switch SW1 may be any kind of switch provided its moving contact is capable of connecting with two fixed contacts among fixed contacts that are sequentially arranged.

(Modification 2)

In the embodiment described above, the number of fixed contacts is three and the number of positions of the moving contact is five in the switch SW1 of the timbre selector S. However, the number of fixed contacts and number of positions of the moving contact of the switch SW1 are not limited thereto. The number of fixed contacts need only be one or more, and the number of positions of the moving contact need only be two or more. The number of filters that the timbre selector S has is not limited to three, and need only be two or more.

(Modification 3)

In the embodiment described above, the case is described of the filter 21 being a notch filter, the filter 22 being a filter with a flat frequency response, and the filter 23 being a low-pass filter. However, the types of the filters 21 to 23 are not limited to these. For example, the filters 21 to 23 may be high-pass filters or band-pass filters.

In the embodiment described above, the case is described of a notch filter and a filter having a flat frequency response being connected in parallel when the position of the lever L is at the position P2, and the filter having a flat frequency response and a low-pass filter being connected in parallel when the position of the lever L is at the position P4. However, the combinations of filters connected in parallel are not limited to these. For example, a notch filter may be connected to one fixed contact of the two fixed contacts to be connected, and any one of a notch filter, a filter having a flat frequency response, a low-pass filter, a high-pass filter, and a band-bass filter may be connected to the other. The combination pattern of the two filters is selectable in a matrix manner.

(Modification 4)

In the embodiment described above, the case is described of changing the frequency response of the filter 23 by interposing a resistor 30 as a circuit element (circuit) between the connection terminal $T_{3C}$ of the filter 23 and the output terminal $T_{3OUT}$ of the filter 23. However, the element that changes the frequency response of the filter 23 is not limited to the resistor 30. The circuit element need only be capable of changing the frequency response of the filter. For example, a capacitor may be used instead of the resistor 30. A circuit includes a resistor and a capacitor may be used instead of the resistor 30. Also, in the aforementioned embodiment, the case is described of interposing the resistor 30 in the filter 23, which is a low-pass filter. However, the filter in which is imposed an element or circuit that changes its frequency response, such as the resistor 30, is not limited to a low-pass filter. For example, in the case of wanting to change the frequency response of a notch filter, a circuit element such as the resistor 30 or a circuit may be interposed in a notch filter. Accordingly, it is possible to use unrestricted combinations in which a resistor, a capacitor, a circuit including a resistor and a capacitor, or the like is interposed in each type of filter shown in modification 3 described above. Also, by switching the element or circuit (resistor, capacitor, combination of a resistor and capacitor) that is to be interposed in one filter, the frequency response may be altered in a variety of ways. In addition, a constitution that alters the frequency response of a filter is not limited to the case of filters being connected in parallel (such as the case of the position of the lever L being at the position P4). In the case of having selected one filter, the frequency response of that filter may be changed.

(Modification 5)

In the embodiment described above, the case is described of the moving contact 14 of the switch SW2 for changing the frequency response of the filter 23 moving together with the moving contact 4 of the switch SW1 for selecting a timbre. However, instead of the moving contact 14 of the switch SW2 being coupled with the moving contact 4 of the switch SW1, a separate lever may be coupled to the moving contact 14 of the switch SW2, so as to be able to operate the moving contact 14 of the switch SW2 independently of the switch SW1.

(Modification 6)

In the embodiment described above, the timbre that is selected by the lever L is the timbre suited to each bass playing method. However, the timbre that is selected by the lever L is not limited to the timbre suited to each bass playing method, and may be any timbre.

(Modification 7)

In the embodiment described above, the timbre selector S is mounted in the bass 100, but it not limited thereto. For example, the timbre selector S may be mounted in an electric guitar or another musical instrument such as an acoustic guitar in which a pickup is mounted. Also, rather than a musical instrument itself, the timbre selector S may be mounted in other audio equipment such as an amplifier that the bass is connected to.

(Modification 8)

In the embodiment described above, the switch SW1 is configured such that it includes the fixed contacts 1 to 3 and the moving contact 4. However, the configuration of the switch SW1 is not limited to this. The switch SW1 may have any configuration provided it can select one or more filters from the filters 21 to 23.

In the embodiment described above, the switch SW2 is configured such that it includes the fixed contacts 11 to 13 and the moving contact 14. However, the configuration of the switch SW2 is not limited to this. The switch SW2 may have any configuration provided it can switch between connection and disconnection of the filter 23 and the resistor 30.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A timbre selector comprising:
a first signal processing unit that includes a first input terminal, a first filter and a first output terminal, the first input terminal receiving a first tone signal, the first filter processing the first tone signal to generate a first processed signal, the first output terminal outputting the first processed signal;
a second signal processing unit that includes a second input terminal, a second filter and a second output terminal, the second input terminal receiving a second tone signal, the second filter processing the second tone signal to generate a second processed signal, the second output terminal outputting the second processed signal; and
a first switch that switches between a plurality of positions including first, second and third positions, the first switch being connected to the first output terminal at the first position, the first switch being connected to the first and second output terminals at the second position, the first switch being connected to the second output terminal at the third position,
the first switch outputting the first processed signal at the first position, the first switch outputting the first and second processed signals at the second position, the first switch outputting the second processed signal at the third position.

2. The timbre selector according to claim 1, wherein
in a case of being at the first position, the first switch is connected to only the first output terminal and outputs only the first processed signal, and
in a case of being at the third position, the first switch is connected to only the second output terminal and outputs only the second processed signal.

3. The timbre selector according to claim 1, wherein
the second input terminal is connected to the first input terminal, and
the second tone signal is the same as the first tone signal.

4. The timbre selector according to claim 1, wherein the first switch further includes an operator that selects one from the plurality of positions.

5. The timbre selector according to claim 1, wherein
the first switch further includes a first fixed contact, a second fixed contact and a first moving contact, the first fixed contact being connected to the first output terminal, the second fixed contact being connected to the second output terminal, the first moving contact moving so as to be connected to the first and second fixed contacts,
the first moving contact is connected to the first fixed contact when the first switch switches to the first position,
the first moving contact is connected to the first and second fixed contacts when the first switch switches to the second position, and
the first moving contact is connected to the third fixed contact when the first switch switches to the third position.

6. The timbre selector according to claim 1, further comprising:
a third signal processing unit that includes a third input terminal, a third filter and a third output terminal, the third input terminal receiving a third tone signal, the third filter processing the third tone signal to generate a third processed signal, the third output terminal outputting the third processed signal,
wherein the plurality of positions further include a fourth position at which the first switch is connected to the second and third output terminals, and
the first switch outputs the second and third processed signals at the fourth position.

7. The timbre selector according to claim 6, further comprising:
a circuit element that includes a first terminal connected to a connection terminal of the third filter; and
a second switch that switches between connection and disconnection of the third output terminal and a second terminal of the circuit element;
wherein the third filter generates, as the third processed signal, a signal whose frequency response differs depending on a connection state of the third output terminal and the second terminal of the circuit element.

8. The timbre selector according to claim 7, wherein the second switch moves together with the first switch.

9. The timbre selector according to claim 7, wherein
the plurality of positions further include a fifth position at which the first switch is connected to the third output terminal,
the second switch connects the third output terminal to the second terminal of the circuit element when the first switch switches to the fourth position, and
the second switch disconnects the third output terminal from the second terminal of the circuit element when the first switch switches to the fifth position.

10. The timbre selector according to claim 9, wherein
the first switch further includes first, second and third fixed contacts and a first moving contact, the first fixed contact being connected to the first output terminal, the second fixed contact being connected to the second output terminal, the third fixed contact being connected to the third output terminal, the first moving contact moving so as to be connected to the first to third fixed contacts,
the second switch includes fourth, fifth and sixth fixed contacts and a second moving contact, the fourth fixed contact being separate from the first to third output terminals, the fifth fixed contact being connected to the third output terminal, the sixth fixed contact being connected to the second terminal of the circuit element, the second moving contact moving so as to be connected to the fourth to sixth fixed contacts,
the first moving contact is connected to the first fixed contact and the second moving contact is connected to the fourth fixed contact when the first switch switches to the first position,
the first moving contact is connected to the first and second fixed contacts and the second moving contact is connected to the fourth and fifth fixed contacts when the first switch switches to the second position,
the first moving contact is connected to the second fixed contact and the second moving contact is connected to the fifth fixed contact when the first switch switches to the third position,
the first moving contact is connected to the second and third fixed contacts and the second moving contact is connected to the fifth and sixth fixed contacts when the first switch switches to the fourth position, and
the first moving contact is connected to the third fixed contact and the second moving contact is connected to the sixth fixed contact when the first switch switches to the fifth position.

11. The timbre selector according to claim 1, further comprising:
a circuit element that includes a first terminal connected to a connection terminal of the second filter; and
a second switch that switches between connection and disconnection of the second output terminal and a second terminal of the circuit element,
wherein the second filter generates, as the second processed signal, a signal whose frequency response differs depending on a connection state of the second output terminal and the second terminal of the circuit element.

12. A musical instrument comprising the timbre selector according to claim 1.

13. A timbre selecting method comprising:
processing a first tone signal by a first signal processing unit to generate a first processed signal;
processing a second tone signal by a second signal processing unit to generate a second processed signal;
connecting a first switch to one or both of the first and second signal processing units;
outputting the first processed signal when the first switch is connected to the first signal processing unit;
outputting the second processed signal when the first switch is connected to the second signal processing unit; and
outputting the first and second processed signals when the first switch is connected to the first and second signal processing units.

* * * * *